United States Patent
Ha et al.

(10) Patent No.: US 9,666,654 B2
(45) Date of Patent: May 30, 2017

(54) ORGANIC LIGHT-EMITTING DISPLAY DEVICE

(71) Applicant: SAMSUNG DISPLAY CO., LTD., Yongin-si, Gyeonggi-do (KR)

(72) Inventors: Jae-Heung Ha, Yongin-si (KR); Kyu-Hwan Hwang, Yongin-si (KR); Seok-Gyu Yoon, Yongin-si (KR); Young-Woo Song, Yongin-si (KR); Jong-Hyuk Lee, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/883,923

(22) Filed: Oct. 15, 2015

(65) Prior Publication Data
US 2016/0043156 A1    Feb. 11, 2016

Related U.S. Application Data

(63) Continuation of application No. 13/890,491, filed on May 9, 2013, now Pat. No. 9,165,985, which is a (Continued)

(30) Foreign Application Priority Data

Mar. 9, 2010    (KR) ........................ 10-2010-0021020

(51) Int. Cl.
| | | |
|---|---|---|
| *H01L 29/08* | (2006.01) | |
| *H01L 27/32* | (2006.01) | |
| *H01L 51/50* | (2006.01) | |
| *H01L 51/52* | (2006.01) | |

(52) U.S. Cl.
CPC ........ *H01L 27/3262* (2013.01); *H01L 27/322* (2013.01); *H01L 27/326* (2013.01);
(Continued)

(58) Field of Classification Search
CPC ............... H01L 27/322; H01L 51/5012; H01L 51/5056; H01L 51/5072; H01L 51/5088;
(Continued)

(56) References Cited

U.S. PATENT DOCUMENTS

| | | |
|---|---|---|
| 7,304,696 B2 | 12/2007 | Yamagishi |
| 2003/0067266 A1 | 4/2003 | Kim et al. |

(Continued)

FOREIGN PATENT DOCUMENTS

| | | |
|---|---|---|
| JP | 10-039757 A | 2/1998 |
| JP | 2001-341336 A | 12/2001 |

(Continued)

*Primary Examiner* — Vongsavanh Sengdara
(74) *Attorney, Agent, or Firm* — Lee & Morse P.C.

(57) ABSTRACT

An organic light-emitting display device includes a first substrate having transmitting regions and pixel regions separated from each other by the transmitting regions, a plurality of thin film transistors on the first substrate in the pixel regions, a passivation layer covering the plurality of thin film transistors, a plurality of pixel electrodes on the passivation layer and electrically connected to the thin film transistors, the pixel electrodes being in the pixel regions and overlapping the thin film transistors, an opposite electrode in the transmitting regions and the pixel regions, the opposite electrode facing the plurality of pixel electrodes and being configured to transmit light, an organic emission layer interposed between the pixel electrodes and the opposite electrode, and a color filter in corresponding pixel regions.

19 Claims, 9 Drawing Sheets

Related U.S. Application Data continuation of application No. 13/064,114, filed on Mar. 7, 2011, now Pat. No. 8,466,466.

(52) U.S. Cl.
CPC ...... *H01L 27/3244* (2013.01); *H01L 27/3246* (2013.01); *H01L 27/3258* (2013.01); *H01L 27/3276* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5246* (2013.01); *H01L 51/5218* (2013.01); *H01L 2251/5315* (2013.01); *H01L 2251/5323* (2013.01)

(58) Field of Classification Search
CPC ............ H01L 51/5092; H01L 51/5218; H01L 51/5246; H01L 27/3244; H01L 27/3246; H01L 27/3258; H01L 27/326; H01L 27/3262; H01L 27/3276; H01L 2251/5323; H01L 2251/5315
USPC ......................................................... 257/40
See application file for complete search history.

(56) References Cited

U.S. PATENT DOCUMENTS

| | | |
|---|---|---|
| 2003/0107688 A1 | 6/2003 | Yamagishi |
| 2005/0001546 A1* | 1/2005 | Yamaguchi ............ C23C 14/042 313/512 |
| 2005/0073230 A1* | 4/2005 | Nishikawa .......... H01L 27/3211 313/111 |
| 2006/0001366 A1* | 1/2006 | Chung ................ H01L 27/3276 313/506 |
| 2006/0017871 A1 | 1/2006 | Morimoto et al. |
| 2007/0108899 A1 | 5/2007 | Jung et al. |
| 2007/0123135 A1 | 5/2007 | Yang et al. |
| 2007/0263167 A1 | 11/2007 | Oda et al. |
| 2009/0008643 A1* | 1/2009 | Yamazaki ......... H01L 21/67207 257/59 |
| 2009/0066236 A1 | 3/2009 | Sung et al. |
| 2009/0153046 A1 | 6/2009 | Hayashi et al. |
| 2009/0206741 A1* | 8/2009 | Yoon ..................... B82Y 10/00 313/504 |
| 2009/0243470 A1 | 10/2009 | Chu et al. |
| 2010/0006872 A1 | 1/2010 | Seo et al. |
| 2010/0141125 A1* | 6/2010 | Otsu ................... C07F 15/0033 313/504 |

FOREIGN PATENT DOCUMENTS

| | | |
|---|---|---|
| JP | 2005-345946 A | 12/2005 |
| KR | 10-2007-0056468 A | 6/2007 |
| KR | 10-2007-0056469 A | 6/2007 |
| KR | 10-2008-0025500 A | 3/2008 |
| KR | 10-2008-0051220 A | 6/2008 |
| KR | 10-2009-0103546 A | 10/2009 |

* cited by examiner

ORGANIC LIGHT-EMITTING DISPLAY DEVICE

CROSS REFERENCE TO RELATED APPLICATIONS

This is a continuation application based on pending application Ser. No. 13/890,491, filed May 9, 2013, which in turn is a continuation of application Ser. No. 13/064,114, filed Mar. 7, 2011, now U.S. Pat. No. 8,466,466 B2, the entire contents of both of which is hereby incorporated by reference.

BACKGROUND

1. Field

Embodiments relate to an organic light-emitting display device and, more particularly, to a transparent organic light-emitting display device.

2. Description of the Related Art

Applications of organic light-emitting display devices range from personal portable devices, e.g., MP3 players and mobile phones, to television sets due to their superior characteristics, e.g., wide viewing angles, high contrast ratios, short response times, and low amounts of power consumption. An organic light-emitting display device has self-light emitting characteristics, and weight and thickness of the organic light-emitting display device may be reduced since the organic light-emitting display device does not require an additional light source, unlike a liquid crystal display device.

Also, an organic light-emitting display device may be formed as a transparent display device by having transparent thin film transistors and transparent organic light-emitting devices. For example, when such a transparent display device is in an off-state, an object or an image positioned on a side of the device opposite to the user is transmitted to the user through patterns of organic light-emitting diodes, thin film transistors, and various wires, as well as through spaces between the various patterns.

SUMMARY

Embodiments are directed to a transparent organic light-emitting display device, which substantially overcomes one or more of the problems due to the limitations and disadvantages of the related art.

It is therefore a feature of an embodiment to provide a transparent organic light-emitting display device with improved transparency in transmitting regions.

It is therefore another feature of an embodiment to provide a transparent organic light-emitting display device with an enhanced color reproduction range without variation in color coordinates due to viewing angles.

It is yet another feature of an embodiment to provide a transparent organic light-emitting display device with reduced light scattering, thereby preventing distortion of a transmitted image.

At least one of the above and other features and advantages may be realized by providing an organic light-emitting display device, including a first substrate having transmitting regions and pixel regions separated from each other by the transmitting regions, a plurality of thin film transistors on the first substrate in the pixel regions, a passivation layer covering the plurality of thin film transistors, a plurality of pixel electrodes on the passivation layer and electrically connected to the thin film transistors, the pixel electrodes being in the pixel regions and overlapping the thin film transistors, an opposite electrode in the transmitting regions and the pixel regions, the opposite electrode facing the plurality of pixel electrodes and being configured to transmit light, an organic emission layer interposed between the pixel electrodes and the opposite electrode, and a color filter in corresponding pixel regions.

Each pixel electrode may have an area identical to that of one of a corresponding pixel region.

The organic light-emitting display device may further include a plurality of conductive lines electrically connected to the thin film transistors respectively, wherein at least one of the conductive lines is arranged to overlap each of the pixel electrodes.

A ratio of a total area of the transmitting regions with respect to a total area of the pixel regions and the transmitting regions may be between 5% and 90%.

The passivation layer may include a transparent material.

The pixel electrode may be a reflective electrode.

The organic light-emitting display device may further include a second substrate disposed to face the opposite electrode and bonded to the first substrate, the color filter being on a surface of the second substrate facing the opposite electrode, and a conduction unit interposed between and contacting the second substrate and the opposite electrode, the conduction unit including a conductive material and being disposed between color filters.

Each color filter may be only in a respective pixel region.

The color filter and a respective pixel electrode may overlap each other.

The color filter may be separated from the opposite electrode.

At least one of the above and other features and advantages may also be realized by providing an organic light-emitting display device, including a first substrate having transmitting regions and pixel regions separated from each other by the transmitting regions, a plurality of pixel circuit units on the first substrate in the pixel regions, each pixel circuit unit including at least one thin film transistor, a first insulating layer covering the pixel circuit units, a plurality of pixel electrodes on the first insulating layer and electrically connected to the pixel circuit units, the pixel electrodes overlapping and covering the pixel circuit units, an opposite electrode in the transmitting regions and pixel regions, the opposite electrode facing the pixel electrodes and being configured to transmit light, an organic emission layer interposed between the pixel electrodes and the opposite electrode to emit light, and a color filter in corresponding pixel regions.

The pixel electrodes may be formed in the pixel regions respectively.

The organic light-emitting display device may further include a plurality of conductive lines electrically connected to the pixel circuit units respectively, wherein at least one of the conductive lines is arranged to cross each of the pixel regions.

A ratio of a total area of the transmitting region with respect to a total area of the pixel regions and the transmitting region may be between 5% and 90%.

The transmitting region and the pixel regions each may include the first insulating layer and a plurality of second insulating layers, and the first insulating layer and the second insulating layers may include a transparent material.

The pixel electrode may be a reflective electrode.

The organic light-emitting display device may further include: a second substrate disposed to face the opposite electrode and bonded to the first substrate; and a conduction unit interposed between the second substrate and the opposite electrode, having a first end contacting the second substrate and a second end contacting the opposite electrode, and including a conductive material, wherein the color filter is formed on a surface of the second substrate towards the opposite electrode, and the conduction unit is disposed between the color filters.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
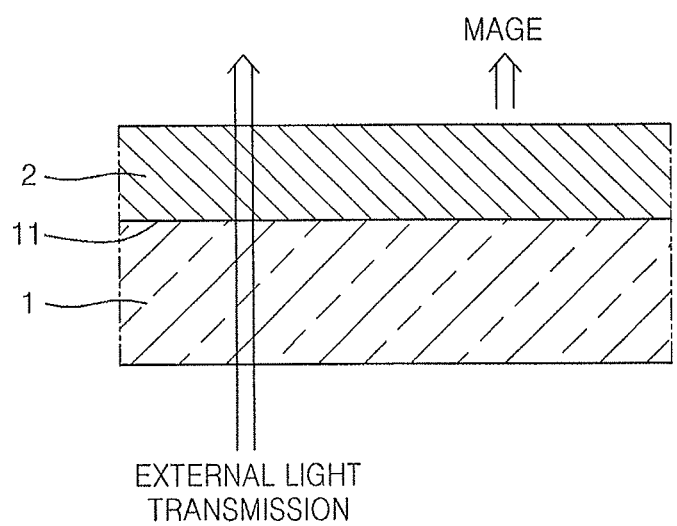
FIG. 1 illustrates a cross-sectional view of an organic light-emitting display device according to an embodiment.

Korean Patent Application No. 10-2010-0021020, filed on Mar. 9, 2010, in the Korean Intellectual Property Office, and entitled: "Organic Light-Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an organic light-emitting display device according to an embodiment. Referring to FIG. 1, the organic light-emitting display device according to the current embodiment includes a display unit 2 formed on a first surface 11 of a first substrate 1.

In the organic light-emitting display device illustrated in FIG. 1, external light enters through the first substrate 1 and exits through the display unit 2. As will be described later, the display unit 2 is formed to be able to transmit external light. That is, referring to FIG. 1, the display unit 2 is formed in such a way that a user positioned on a side where an image is displayed can observe an object below the first substrate 1, i.e., an object at a side of a surface of the first substrate 1 opposite the first surface 11.

Figure 2:
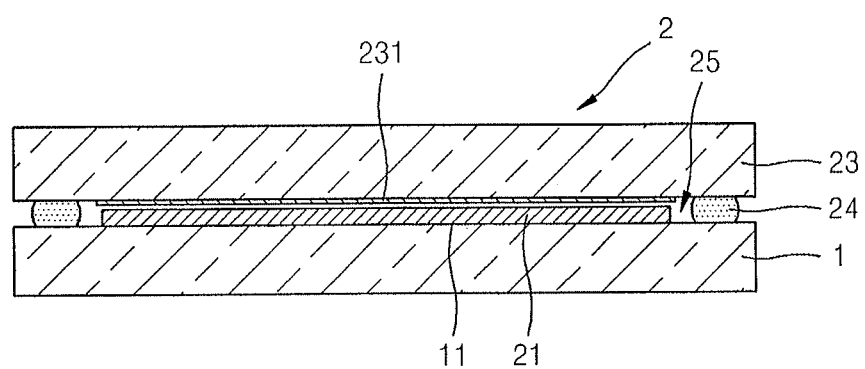
FIG. 2 illustrates a detailed cross-sectional view of the organic light-emitting display device of FIG. 1 according to an embodiment.

FIG. 2 illustrates a cross-sectional view of the organic light-emitting display device of FIG. 1 in detail. The display unit 2 includes an organic emission unit 21 disposed on the first surface 11 of the first substrate 1 and a second substrate 23 to seal the organic emission unit 21.

The second substrate 23 may be formed of a transparent material to allow viewing of an image generated by the organic emission unit 21. Edge portions of the first substrate 1 and the second substrate 23 may be sealed by a sealant 24. Thus, external air and moisture may be prevented from penetrating into the organic emission unit 21. A space 25 may be formed between the first substrate 1 and the second substrate 23. The space 25 may be a vacuum or may be filled, e.g., with an absorbent, a filler, and so forth.

A color filter 231 may be disposed on a surface of the second substrate 23, e.g., a surface of the second substrate 23 facing the space 25 and the first substrate 1, but is not limited thereto. The color filter 231 may be located anywhere between a light emitting portion of the organic emission unit 21 and the viewing surface, i.e., a surface of the display unit 2 facing away from the space 25 and the first substrate 1. A detailed description of the color filter 231 will be provided later.

Figure 3:
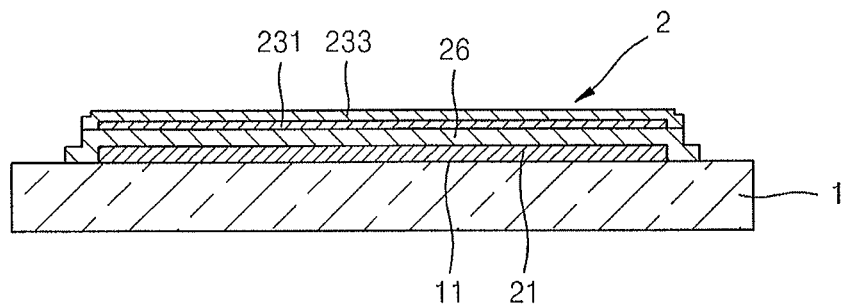
FIG. 3 illustrates a detailed cross-sectional view of the organic light-emitting display device of FIG. 1 according to another embodiment.

FIG. 3 illustrates a detailed cross-sectional view of the organic light-emitting display device of FIG. 1 according to another embodiment. As shown in FIG. 3, a thin sealing film 26 may be formed on the organic emission unit 21 to protect the organic emission unit 21 from external air. The thin sealing film 26 may have a structure in which films formed of an inorganic material, e.g., silicon oxide or silicon nitride, and films formed of an organic material, e.g., epoxy or polyimide, are alternately stacked, but is not limited thereto, and the thin sealing film 26 may have any thin film type sealing structure.

As further illustrated in FIG. 3, the color filter 231 may be formed on the thin sealing film 26. A passivation layer 233 may be formed to cover the color filter 231.

Figure 4:
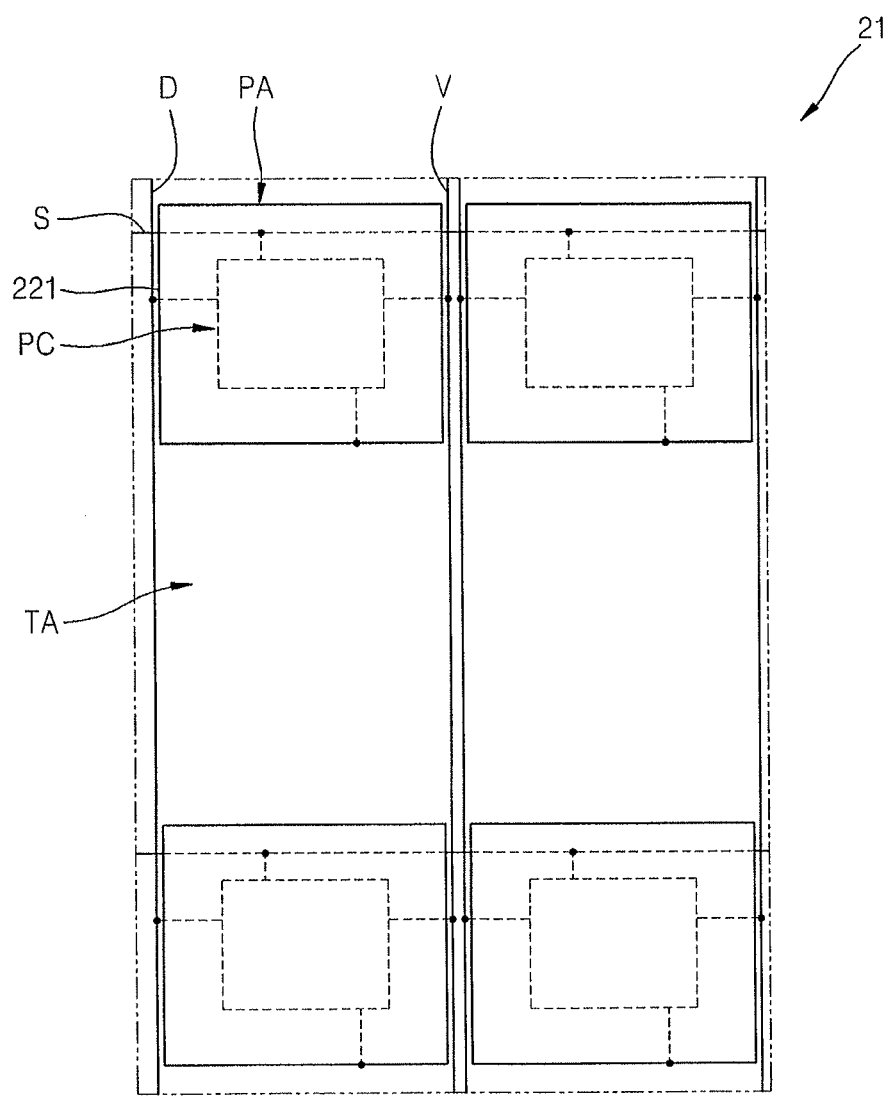
FIG. 4 illustrates a schematic drawing of an organic emission unit according to an embodiment.
Figure 5:
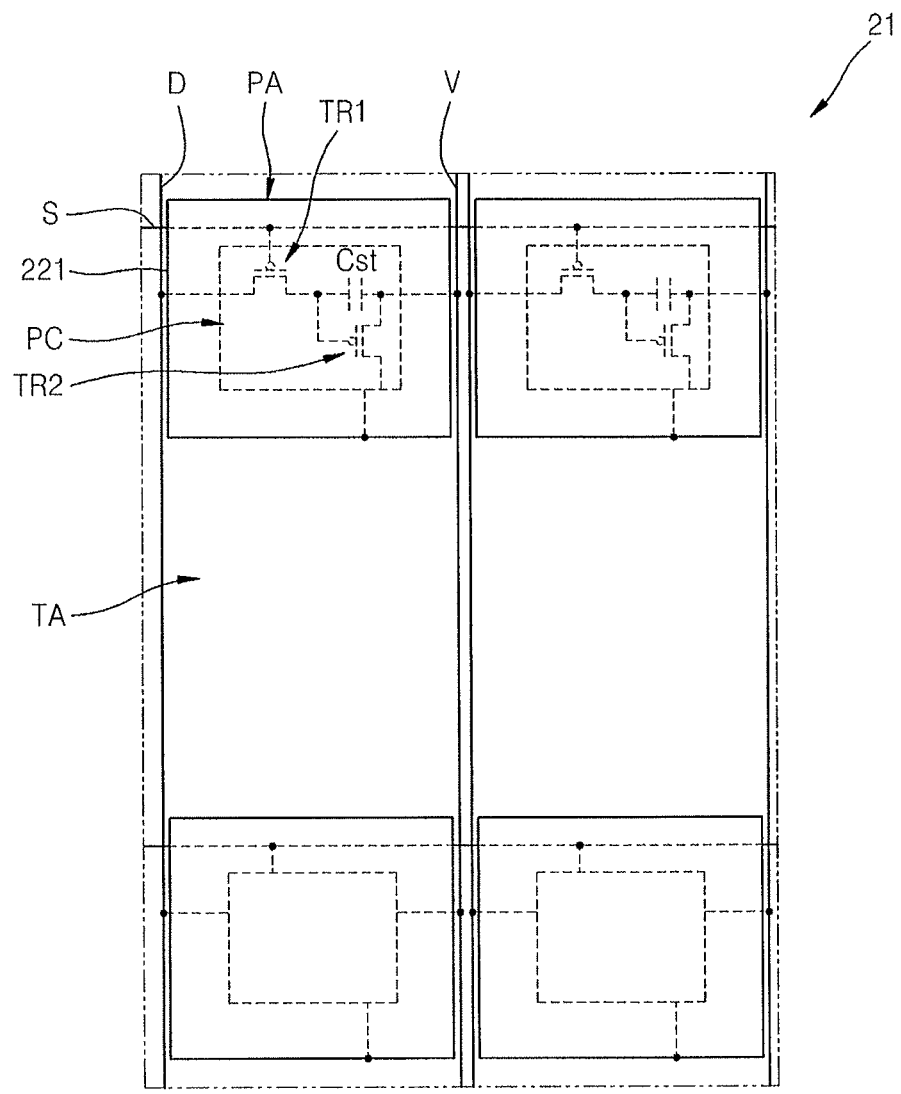
FIG. 5 illustrates a schematic drawing of a pixel circuit unit of the organic emission unit of FIG. 4 according to an embodiment.

FIG. 4 illustrates a schematic drawing of the organic emission unit 21 according to an embodiment, e.g., corresponding to the structures of FIG. 2 or FIG. 3. FIG. 5 illustrates a schematic drawing of a pixel circuit unit PC of the organic emission unit of FIG. 4 according to an embodiment.

Referring to FIGS. 2 through 5, the organic emission unit 21 of the present embodiment may be formed on the first substrate 1. The first substrate 1 may be divided into transmitting regions TA for transmitting external light and a plurality of pixel regions PA separated from each other and having the transmitting regions TA interposed therebetween. For example, one transmitting region TA may extend to separate a plurality of pixel regions PA. In another example, a plurality of transmitting regions TA may be arranged to separate a plurality of pixel regions PA.

Each of the pixel regions PA may include a pixel circuit unit PC and a plurality of conductive lines, e.g., a scan line S, a data line D, a Vdd line V, etc., which are electrically connected to the pixel circuit unit PC, as illustrated in FIG. 4. Although not shown, various other conductive lines may further be connected to the pixel circuit unit PC according to the configuration of the pixel circuit unit PC.

As illustrated in FIG. 5, the pixel circuit unit PC may include a first thin film transistor (TFT) TR1 connected to the scan line S and the data line D, a second TFT TR2 connected to the first TFT TR1 and the Vdd line V, and a capacitor Cst connected to the first TFT TR1 and the second TFT TR2. The first TFT TR1 is a switching transistor and the second TFT TR2 is a driving transistor. The second TFT TR2 is electrically connected to a pixel electrode 221. In FIG. 5, the first TFT TR1 and the second TFT TR2 are P-type transistors, but are not limited thereto, and at least one of the first TFT TR1 and the second TFT TR2 may be an N-type transistor. It is noted that the number of TFTs and the number of capacitors are not limited to that shown in FIG. 5, e.g., two or more TFTs and one or more capacitors may be combined with each other depending on the pixel circuit unit PC.

As illustrated in FIGS. 4 and 5, the scan line S may be disposed to overlap the pixel electrode 221 in the pixel region PA, e.g., extend to overlap a plurality of adjacent pixel electrodes 221 along a first direction in corresponding pixel regions PA. However, example embodiments are not limited thereto, e.g., at least one of the conductive lines including the scan line S, the data line D, and the Vdd line V, may be disposed to overlap the pixel electrode 221 and the remaining conductive lines may be disposed beside the pixel electrode 221. For example, all the conductive lines, e.g., the scan line S, the data line D, and the Vdd line V, may be disposed to overlap the pixel electrode 221.

In detail, external image distortion occurs due to scattering of transmitted external light, e.g., light scattered due to patterns of internal devices, e.g., conductive lines. The organic light-emitting display device according to example embodiments, however, is divided into the pixel regions PA and the transmitting regions TA as described above. Therefore, as a user is observing an outside view through the transmitting regions TA of the organic light-emitting display device, the distortion may be prevented or substantially minimized.

In more detail, as at least one of the conductive lines, e.g., the scan line S, the data line D, and the Vdd line V, is disposed in the pixel region PA, visibility of the conductive lines in the transmitting regions TA may be prevented or substantially minimized. Further, even if the conductive lines are disposed between the pixel regions PA to cross the transmitting regions TA, since the conductive lines are very thin, the conductive lines can hardly be seen by the user and have little effect on the overall transmittance of the organic emission unit 21. Accordingly, a transparent display can be realized.

Also, even if the user may not see an external image as much in regions covered by the pixel regions PA, in consideration of the overall display region that includes the transmitting regions TA, there is little effect on observing the external image since the pixel regions PA are like a plurality of spaced apart dots regularly arranged on a surface of a transparent glass. That is, the transmitting regions TA and the pixel regions PA are formed in such a way that a ratio of the area of the transmitting regions TA with respect to the overall area of the transmitting regions TA and the pixel regions PA is about 5% to about 90%.

If the ratio of the area of the transmitting regions TA with respect to the overall area of the transmitting regions TA and the pixel regions PA is less than 5%, the user can hardly see an object or image on a side opposite to the user due to lack of transmitted light through the display unit 2 when the display 2 unit is in an off-state, i.e., the display unit 2 is not a transparent device. If the ratio of the area of the transmitting regions TA with respect to the overall area of the transmitting regions TA and the pixel regions PA is at least 5% and the pixel regions PA are present in an island state with respect to the transmitting regions TA, scattering of light is minimized since all conductive patterns are disposed across the pixel regions PA. Thus, the display unit 2 may be recognized as a transparent display unit by the user. As will be described later, when a TFT included in the pixel circuit unit PC is a transparent TFT, e.g., an oxide semiconductor, and an organic light-emitting device is a transparent device, the display unit 2 may further be recognized as a transparent display unit.

If the ratio of the area of the transmitting regions TA with respect to the entire area of the pixel regions PA and the transmitting regions TA is greater than 90%, pixel integrity of the display unit 2 is excessively reduced. Thus, a stable image can hardly be realized through the light emission from the pixel regions PA. That is, as the area of the pixel regions PA is reduced, the amount of light emitted from an organic emission layer 223, which will be described later, must be increased in order to realize an image. However, if the organic light-emitting device is operated to emit light having a relatively high brightness, the lifetime of the organic light-emitting device rapidly decreases. Also, when the ratio of the area of the transmitting regions TA with respect to the entire area of the pixel regions PA and the transmitting regions TA is greater than 90%, while the size of a single pixel region PA is maintained at an appropriate size, the number of pixel regions PA is reduced, and accordingly, the resolution of the organic light-emitting device is reduced.

For example, the ratio of the area of the transmitting regions TA with respect to the entire area of the pixel regions PA and the transmitting regions TA may be in a range of about 20% to about 70%. When the ratio of the area of the transmitting regions TA with respect to the entire area of the pixel regions PA and the transmitting regions TA is less than 20%, the ratio of the area of the pixel regions PA with respect to the area of the transmitting regions TA is excessively large. Therefore, observing an external image through the transmitting regions TA may be limited. If the ratio of the area of the transmitting regions TA with respect to the entire area of the pixel regions PA and the transmitting regions TA exceeds 70%, there may be limitations in designing the pixel circuit unit PC.

Each of the pixel regions PA may include the pixel electrode 221 having an area corresponding, e.g., in terms of shape and size, to the area of each of the pixel regions PA and is electrically connected to the pixel circuit unit PC. The pixel circuit unit PC may overlap the pixel electrode 221, e.g., the pixel electrode 221 may completely overlap the pixel circuit unit PC. Thus, the pixel circuit unit PC may be covered, e.g., completely covered, by the pixel electrode 221. Also, at least one of the conductive lines, e.g., one of the scan line S, the data line D, and the Vdd line V, may be disposed to cross the pixel electrode 221. The conductive lines may hardly interfere with light transmittance in the transmitting regions TA. Thus, the conductive lines may be disposed adjacent to the pixel electrode 221 depending on design conditions. Since the pixel electrode 221 includes a reflective layer formed of conductive metal at which light reflection occurs, as will be described later, the pixel electrode 221 covers the pixel circuit unit PC overlapping the pixel electrode 221 and prevents external image distortion caused by the pixel circuit unit PC in the pixel regions PA.

Figure 6:
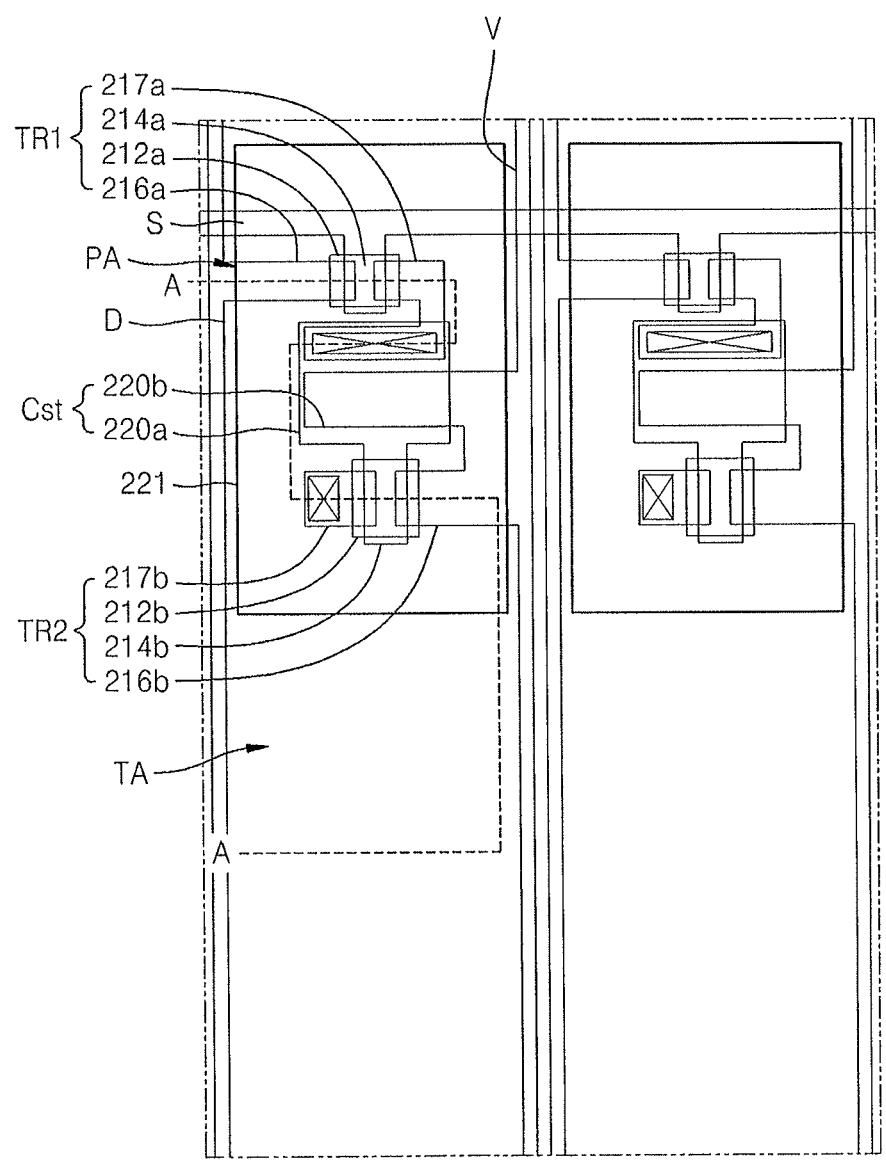
FIG. 6 illustrates a plan view of the organic emission unit of FIG. 5.
Figure 7:
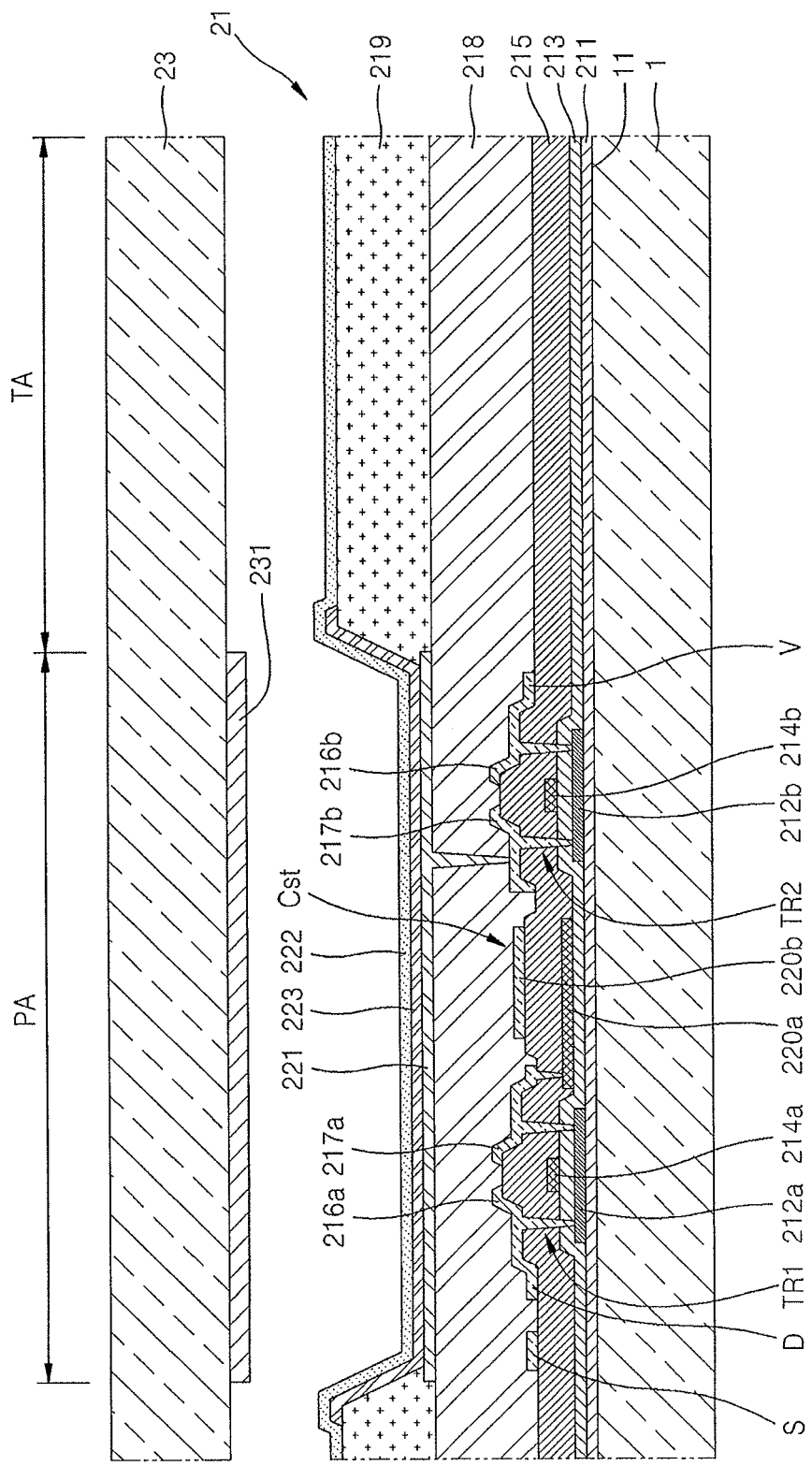
FIG. 7 illustrates a cross-sectional view taken along line A-A of FIG. 6.

FIG. 6 illustrates a plan view of an exemplary pixel circuit unit PC in the organic emission unit 21 of FIG. 5. FIG. 7 illustrates a cross-sectional view taken along line A-A of FIG. 6.

Referring to FIGS. 6 and 7, the organic emission unit 21 may include a buffer layer 211 on the first surface 11 of the first substrate 1. Further, the first TFT TR1, the capacitor Cst, and the second TFT TR2 may be formed on the buffer layer 211.

The buffer layer 211 prevents impurities from penetrating into the organic emission unit 21 and planarizes the first surface 11 of the first substrate 1. The buffer layer 211 may be formed of any of various materials that can perform the functions described above. For example, the buffer layer 211 may be formed of an inorganic material, e.g., one or more of silicon oxide, silicon nitride, silicon oxynitride, aluminum oxide, aluminum nitride, titanium oxide, and titanium nitride, an organic material, e.g., one or more of polyimide, polyester, and acryl, or any possible combinations of these materials. Alternatively, the buffer layer 211 may be omitted.

Next, a first semiconductor active layer 212a and a second semiconductor active layer 212b may be formed on the buffer layer 211. The first and second semiconductor active layers 212a and 212b may be formed of, e.g., polycrystalline silicon, but are not limited thereto, and may be formed of a semiconductor oxide. For example, the first and second semiconductor active layers 212a and 212b may be G-I-Z-O layers [$(Ga_2O_3)_a(In_2O_3)_b(ZnO)_c$ layer] (where a, b, and c are integers that respectively satisfy a≥0, b≥0, and c>0).

A gate insulating layer 213 for covering the first and second semiconductor active layers 212a and 212b may be formed on the buffer layer 211. First and second gate electrodes 214a and 214b may be formed on the gate insulating layer 213.

An interlayer insulating layer 215 may be formed on the gate insulating layer 213 to cover the first and second gate electrodes 214a and 214b. A first source electrode 216a, a first drain electrode 217a, a second source electrode 216b, and a second drain electrode 217b may each be formed on the interlayer insulating layer 215, and may be respectively connected to the first semiconductor active layer 212a and the second semiconductor active layer 212b through contact holes to finalize the TFTs TR1 and TR2, respectively.

The scan line S may be simultaneously formed with the first and second gate electrodes 214a and 214b. The data line D may be simultaneously formed with the first source electrode 216a and connected to the first source electrode 216a. The Vdd line V may be simultaneously formed with the second source electrode 216b and connected to the second source electrode 216b.

In the capacitor Cst, a lower electrode 220a may be simultaneously formed with the first and second gate electrodes 214a and 214b. Further, an upper electrode 220b may be simultaneously formed with the first drain electrode 217a.

The structures of the first TFT TR1, the capacitor Cst, and the second TFT TR2 are not limited thereto, and any of various types of TFT and capacitor structures may be employed. For example, the first TFT TR1 and the second TFT TR2 have a top gate structure. However, the first TFT TR1 and the second TFT TR2 may have a bottom gate structure in which the first gate electrode 214a and the second gate electrode 214b are disposed on bottom surfaces of the first semiconductor active layer 212a and the second semiconductor active layer 212b, respectively.

A passivation layer 218 may be formed to cover the first TFT TR1, the capacitor Cst, and the second TFT TR2. The passivation layer 218 may be a single layer or multiple layers of insulating layers, an upper surface of which is planarized. The passivation layer 218 may be formed of an inorganic material and/or an organic material.

The pixel electrode 221 may be formed on the passivation layer 218 to cover, e.g., to completely overlap, the first TFT TR1, the capacitor Cst, and the second TFT TR2, as illustrated in FIG. 7. The pixel electrode 221 may be connected to the second drain electrode 217b of the second TFT TR2 through a via hole formed in the passivation layer 218. As shown in FIG. 6, a plurality of the pixel electrodes 221 may be formed as island type electrodes that are independent from each other.

A pixel defining layer 219 may be formed on the passivation layer 218 to cover edge portions of the pixel electrode 221. The organic emission layer 223 and an opposite electrode 222 may be sequentially formed on the pixel electrode 221 in the order stated. The opposite electrode 222 may be formed on all the pixel regions PA and the transmitting regions TA.

The organic emission layer 223 may be a low molecular weight organic film or a polymer organic film. When the organic emission layer 223 is a low molecular weight organic film, the organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials, e.g., copper phthalocyanine (CuPc), N,N'-Di(naphthalene-1-yl)-N,N'-diphenyl-benzidine (NPB), or tris-8-hydroxyquinoline aluminum (Alq3). The low molecular weight organic film may be formed by vacuum deposition. The organic emission layer 223 may be formed in each of red, green, and blue pixels, and the HIL, the HTL, the ETL, and the EIL may be common layers and may be commonly applied to the red, green, and blue pixels. Accordingly, unlike the EML in the organic emission layer 223, the common layers may be formed to cover the pixel regions PA and the transmitting regions TA, similar to the opposite electrode 222.

The pixel electrode 221 functions as an anode electrode, and the opposite electrode 222 functions as a cathode electrode. However, the polarities of the pixel electrode 221 and the opposite electrode 222 may be reversed.

The pixel electrode 221 may be formed to have a size corresponding to the pixel region PA in each pixel. The opposite electrode 222 may be formed as a common electrode to cover all the pixels of the organic emission unit 21.

According to an embodiment, the pixel electrode 221 may be a reflective electrode and the opposite electrode 222 may be a transparent electrode. Accordingly, the organic emission unit 21 may be a top emission type in which an image is displayed in a direction towards the opposite electrode 222.

To this end, the pixel electrode 221 may include a reflective layer formed of a reflective metal, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, and/or an oxide having a relatively high work function, e.g., ITO, IZO, ZnO, or $In_2O_3$. The opposite electrode 222 may be formed of a metal having a relatively low work function, e.g., Ag, Mg, Al, Pt, Pd, Au, Ni, Nd, Ir, Cr, Li, or Ca, or an alloy thereof. The opposite electrode 222 may be formed of a thin film so as to have a relatively high transmittance.

When the pixel electrode 221 is a reflective electrode, the pixel circuit unit PC disposed under the pixel electrode 221 is covered by the pixel electrode 221. Therefore, referring to FIG. 7, at upper outer sides of the opposite electrode 222, the user cannot see the first TFT TR1, the capacitor Cst, and the second TFT TR2 disposed under the pixel electrode 221, as well as covered portions of the scan line S, the data line D, and the Vdd line V.

When the pixel electrode 221 is reflective, light is emitted only toward the user. Thus, the amount of light lost in a direction opposite to the user may be reduced. Also, since the pixel electrode 221 covers various patterns of the pixel circuit unit PC disposed under the pixel electrode 221, as described above, the user can see a clearer external image or object, i.e., image distortion may be minimized.

However, example embodiments are not limited to the above. For example, the pixel electrode 221 may also be a transparent electrode. In this case, the pixel electrode 221 may be formed of an oxide having a relatively high work function, e.g., ITO, IZO, ZnO, or $In_2O_3$, without the above-mentioned reflective layer. If the pixel electrode 221 is a transparent electrode, at the upper outer sides of the opposite electrode 222, the user can see the first TFT TR1, the capacitor Cst, and the second TFT TR2 disposed under the pixel electrode 221, as well as the covered portions of the scan line S, the data line D, and the Vdd line V. However, although the pixel electrode 221 is a transparent electrode, there may be some loss of light since the transmittance of light therethrough cannot be 100%. Therefore, as transmittance of external light through the pixel electrode 221 is reduced, e.g., due to the conductive patterns disposed in the region of the pixel electrode 221, interference due to the conductive patterns may be reduced as compared to when the external light directly enters the conductive patterns. As such, distortion of an external image may be reduced.

The passivation layer 218, the gate insulating layer 213, the interlayer insulating layer 215, and the pixel defining layer 219 may be formed as transparent insulating layers.

As described above, since the opposite electrode 222 is formed of metal in the shape of a thin film so as to increase a transmittance, it may not be easy to constitute a resonance structure in the pixel regions PA. Thus, the color filter 231 may be formed on, e.g., directly on, the surface of the second substrate 23 facing the opposite electrode 222, wherein the second substrate 23 is bonded to the first substrate 1. For example, the color filter 231 may overlap, e.g., completely overlap, the pixel electrode 221.

As shown in FIG. 7, the color filter 231, e.g., a separate color filter 231, may be disposed in a location corresponding to the pixel regions PA, e.g., only in a respective pixel region PA, thereby increasing the color reproduction range in the pixel regions PA and preventing the variation in color coordinates due to viewing angles. In other words, the structure of the color filter 231 according to example embodiments may prevent reduction of a color reproduction range and variation in color coordinates due to viewing angles.

Figure 8:
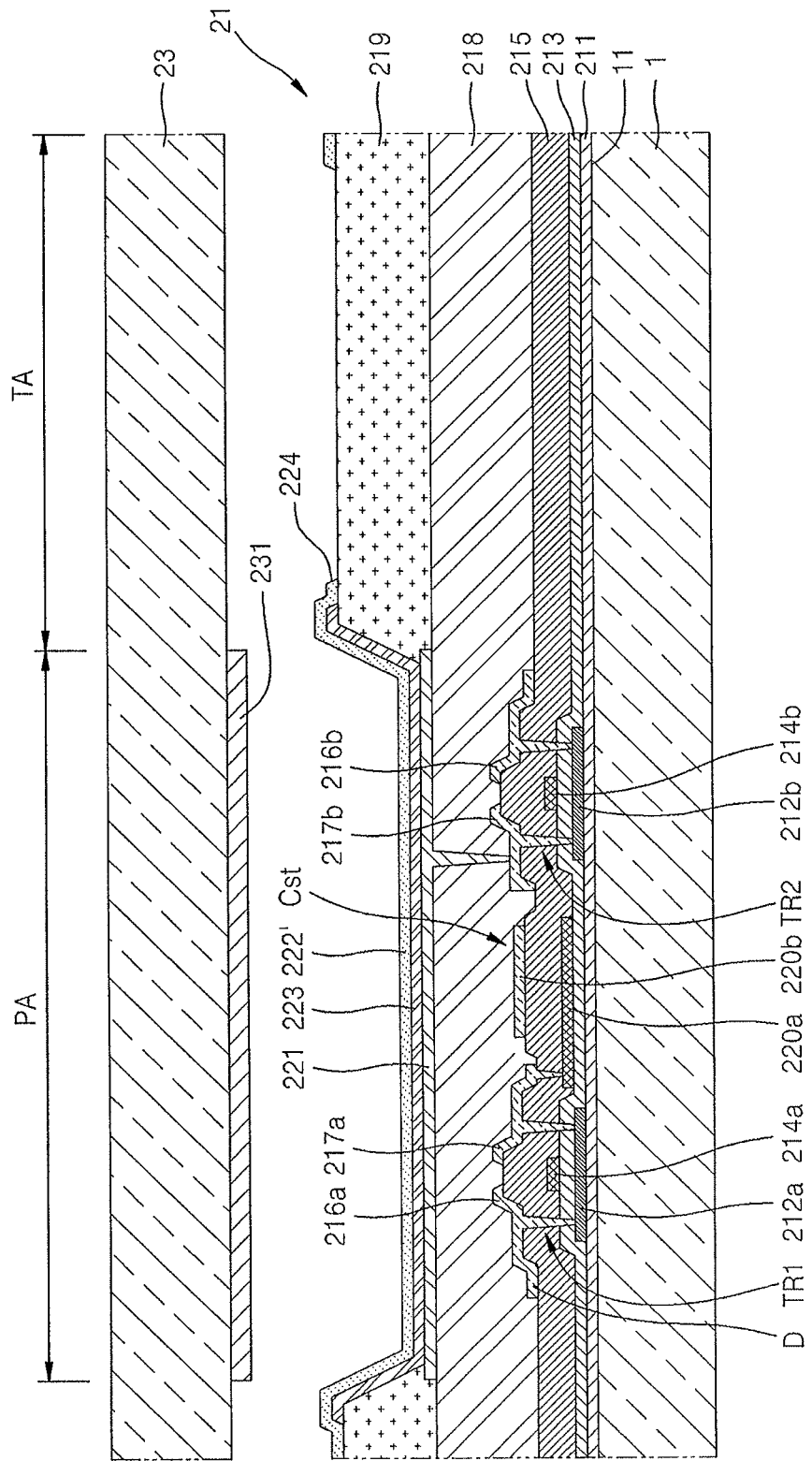
FIG. 8 illustrates a detailed cross-sectional view of the organic emission unit of FIG. 6 according to another embodiment.

FIG. 8 illustrates a cross-sectional view of the organic emission unit 21 according to another embodiment. Referring to FIG. 8, in order to further increase the transmittance of external light in the transmitting regions TA, a first transmission window 224 through an opposite electrode 222 may be formed in at least a portion corresponding to the transmitting regions TA. For example, a portion of the opposite electrode 222 may be removed, e.g., completely removed, in the transmitting region TA to expose the pixel define layer 219.

In detail, in order to increase transmittance of external light in the transmitting regions TA, the area of the transmitting regions TA should be increased or transmittance of various layers in the transmitting regions TA should be increased. In order to avoid design limitations of the pixel circuit unit PC due to increase of the area of the transmitting regions TA, the first transmission window 224 according to example embodiments may be formed to increase transmittance of the various layers formed in the transmitting regions TA.

In more detail, as described above, the organic light-emitting display device according to example embodiments is a top emission structure in which an image is displayed in a direction towards the opposite electrode 222. However, as the opposite electrode 222 is formed of metal, light transmission therethrough may be limited. Further, even when a thickness of the opposite electrode 222 is reduced or is formed of a conductive metal oxide having a relatively high transmittance, a resistance of the opposite electrode 222 may be excessively increased.

Therefore, the first transmission window 224 may be formed in the opposite electrode 222, e.g., through the opposite electrode 222, to expose the pixel define layer 219 in the transmitting region TA. Therefore, the transmittance of external light in the transmitting regions TA may be substantially improved.

Figure 9:
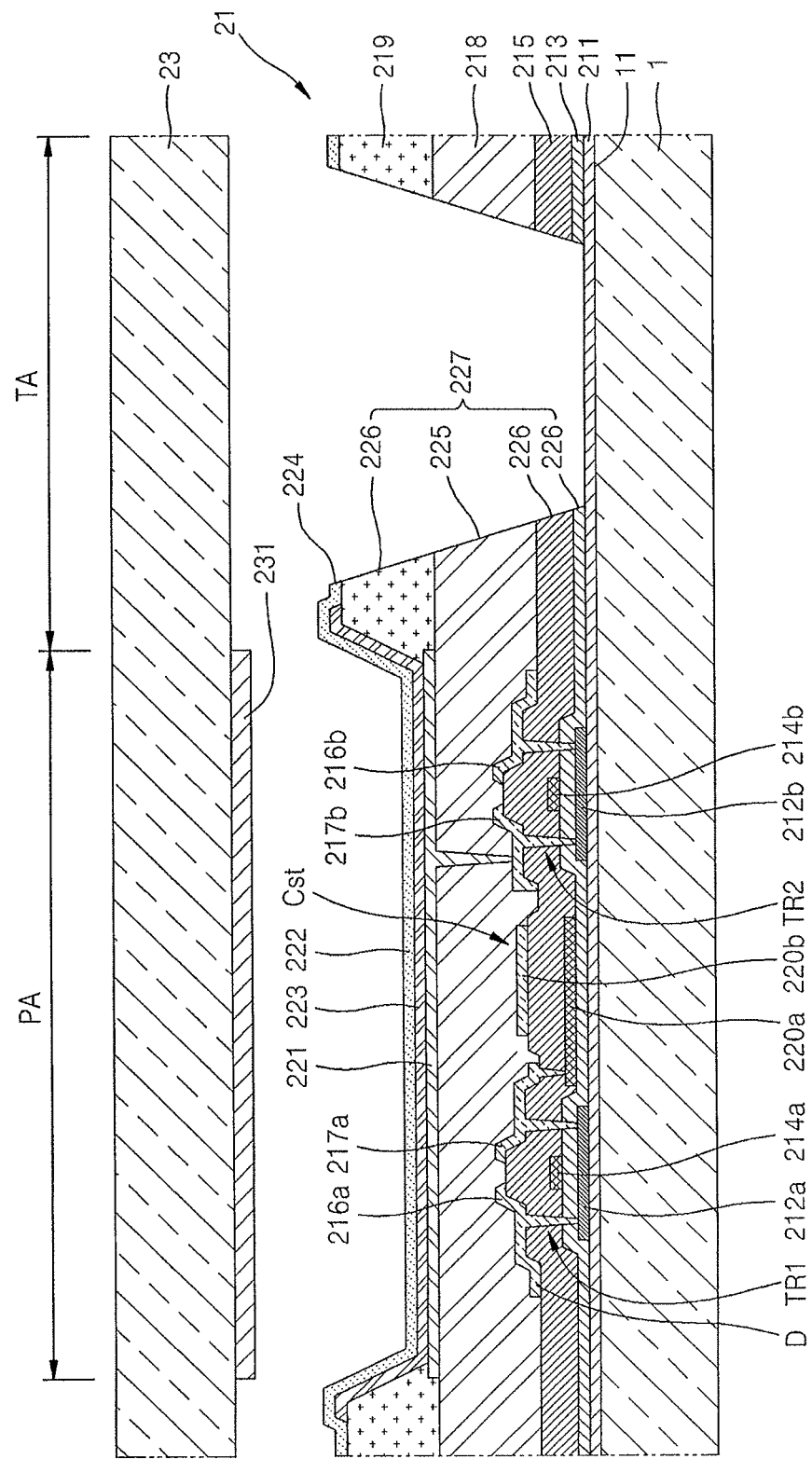
FIG. 9 illustrates a detailed cross-sectional view of the organic emission unit of FIG. 6 according to another embodiment.

FIG. 9 illustrates a cross-sectional view of the organic emission unit 21 according to another embodiment. Referring to FIG. 9, the organic emission unit 21 may include the first transmission window 224 and a second transmission window 227. The second transmission window 227 may be formed through the insulating layers in the transmitting regions TA. The second transmission window 227 may be formed as wide as possible, as long as the transmission window does not interrupt the scan line S, the data line D, and the Vdd line V. The second transmission window 227 may be formed to be connected to the first transmission window 224.

As illustrated in FIG. 9, the second transmission window 227 may include a third transmission window 225 through the passivation layer 218, and a fourth transmission window 226 through the gate insulating layer 213, the interlayer insulating layer 215, and the pixel defining layer 219. The third transmission window 225 and the fourth transmission window 226 may be connected to define the second transmission window 227.

In FIG. 9, the second transmission window 227 is not formed in the buffer layer 211 in order to prevent impurities from penetrating into the first substrate 1. Although not shown, if necessary, the second transmission window 227 may be formed even in the buffer layer 211.

In this way, formation of the second transmission window 227, as well as the first transmission window 224, in the transmitting regions TA may further increase the optical transmittance of the transmitting regions TA. Thus, an external image may be clearly observed by the user.

Figure 10:
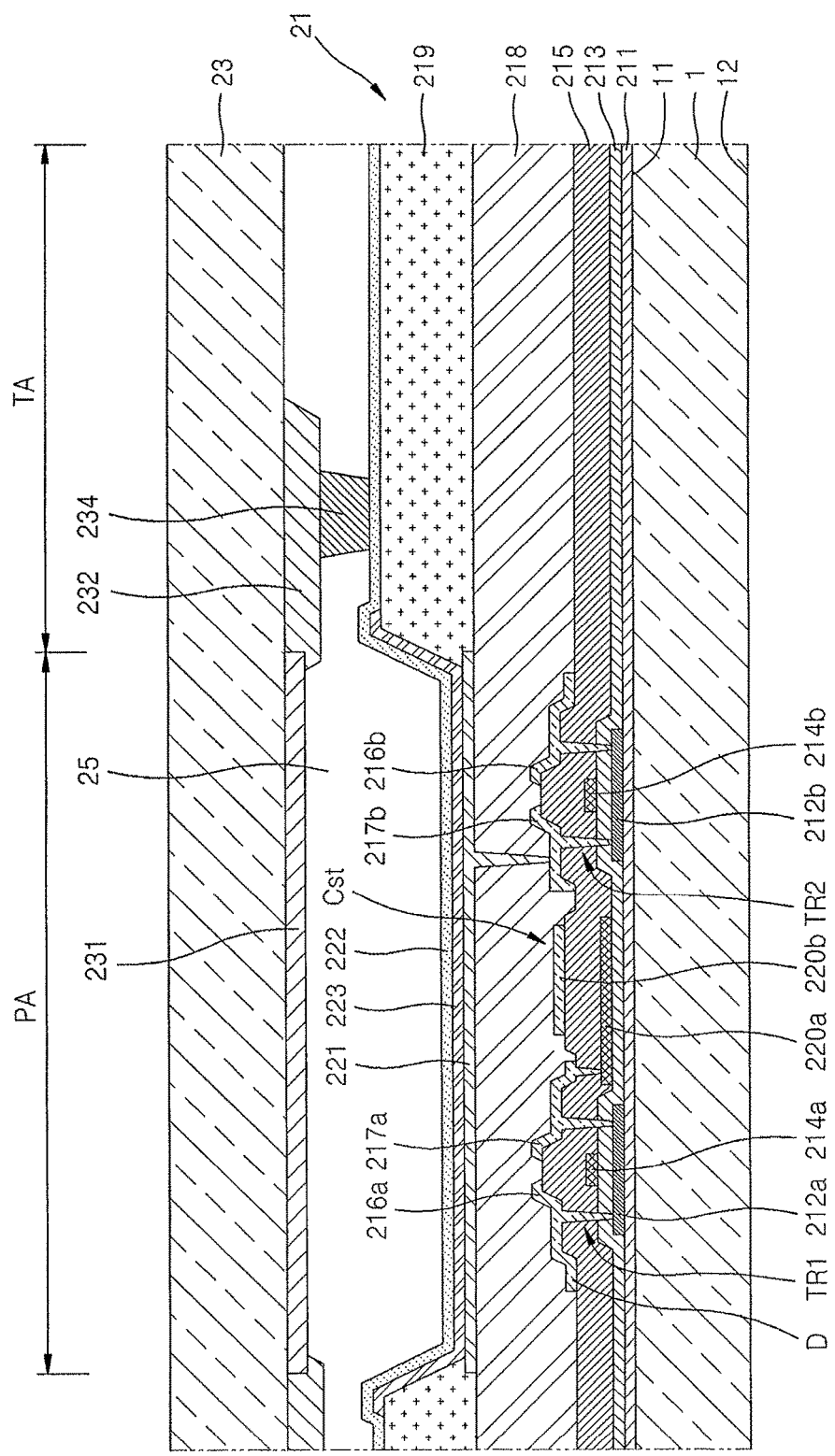
FIG. 10 illustrates a detailed cross-sectional view of the organic emission unit of FIG. 6 according to another embodiment.

FIG. 10 illustrates a cross-sectional view of the organic emission unit 21 according to another embodiment.

As described above, since the opposite electrode 222 is formed of metal in the shape of a thin film so as to increase transmittance, and is formed as a common electrode so as to cover all the pixels of the organic emission unit 21, a sheet resistance is increased and a voltage drop easily occurs. Therefore, as illustrated in FIG. 10, the organic light-emitting display device according to example embodiments may include a conduction unit 234 that is interposed between the second substrate 23 and the opposite electrode 222 in the transmitting regions TA. The conduction unit 234 may include a first end contacting the second substrate 23 and a second end contacting the opposite electrode 222.

The conduction unit 234 may be formed on a black matrix 232 formed on a surface of the second substrate 23 facing the opposite electrode 222. As the second substrate 23 is bonded to the first substrate 1, the conduction unit 234 may contact the opposite electrode 222.

The conduction unit 234 may be formed of metal having relatively high electrical conductivity and may be disposed, e.g., continuously, along edges of the pixel regions PA. For example, the conduction unit 234 may be disposed at edge portions of the first transmission window 224 of FIGS. 8 and 9, so that the conduction unit 234 does not interfere with light transmittance in the transmitting regions TA.

The conduction unit 234 may be disposed between the color filters 231. The conduction unit 234 may be formed on the black matrix 232, which constitutes edges of the pixel regions PA, so that lowering of the transmittance due to the conduction unit 234 may be prevented.

Figure 11:
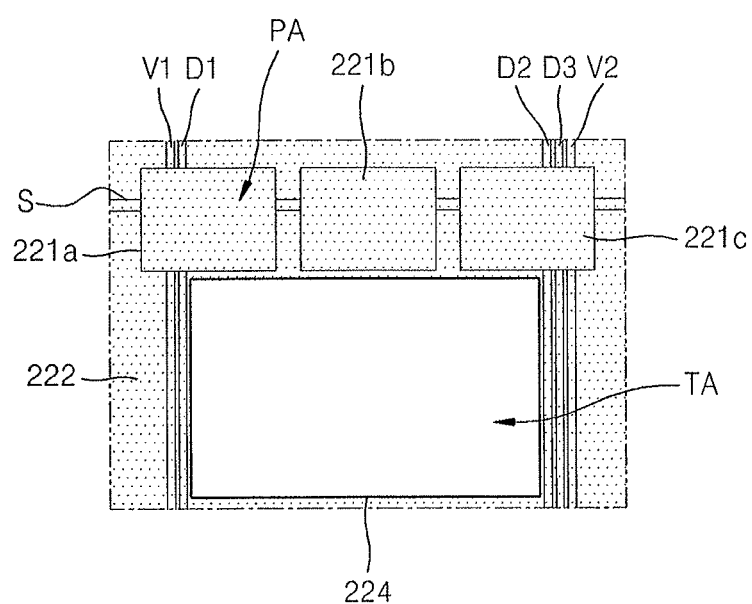
FIG. 11 illustrates a detailed plan view of the organic emission unit according to another embodiment.

FIG. 11 illustrates a detailed plan view of the organic emission unit 21 according to another embodiment. Referring to FIG. 11, one transmitting region TA may be formed to correspond to a first pixel electrode 221*a*, a second pixel electrode 221*b*, and a third pixel electrode 221*c*. First, second, and third data lines D1, D2, and D3 may be electrically connected to the first, second, and third pixel electrodes 221*a*, 221*b*, and 221*c*. A first Vdd line V1 may be electrically connected to the first pixel electrode 221*a* and the second pixel electrode 221*b*, and a second Vdd line V2 may be electrically connected to the third pixel electrode 221*c*.

In such a structure, one large-sized transmitting region TA may be formed in a plurality of, e.g., red, green, and blue subpixels. Thus, transmittance can be further increased, and image distortion due to light scattering can be further reduced. Furthermore, the first transmission window 224 may be formed in a location of the opposite electrode 222 corresponding to the transmitting region TA so that the transmittance may be further increased.

The above-described structures of the organic emission unit 21 illustrated in FIGS. 7 through 10 can be applied to the structure of FIG. 11.

As described above, the organic light-emitting display device according to example embodiments may be a transparent organic light-emitting display device having improved transmittance of external light and enhanced color reproduction range without a variation in color coordinates due to viewing angles. Also, distortion of an image that is transmitted through the organic light-emitting display device may be prevented by eliminating or substantially minimizing scattering of transmitted light.

In contrast, in a conventional transparent organic light-emitting display device, transmittance through the TFTs, the conductive lines, and spaces therebetween may be relative low. Also, a distorted image may be transmitted to the user due to the patterns of the organic light-emitting diodes, TFTs, and wires in the conventional transparent display device. The reason for this is because gaps between the patterns are only a few nanometers wide, i.e., a scale close to the wavelengths of visible light, so light may be scattered through the gaps. Further, a resonance structure of a conventional top emission transparent organic light-emitting display device may be broken, so that a color reproduction range and coordinates may vary according to viewing angles.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting display device having at least a pixel region and at least a transmitting region, the organic light-emitting display comprising:
   a first substrate;
   an organic emission unit disposed on the first substrate, wherein the organic emission unit comprises a first electrode in the pixel region, an emissive layer disposed on the first electrode, and a second electrode disposed on the emissive layer;
   a sealing member disposed on the second electrode;
   an empty space between the first substrate and the sealing member in the transmitting region; and
   a color filter disposed on one surface of the sealing member, the color filter being overlapped with the first electrode,
   wherein an external light incident on the transmitting region passes through the empty space and the transmitting region of the organic light-emitting display device,
   wherein portions of the organic light-emitting display device overlapping the transmitting region are transparent through an entire thickness of the organic light-emitting display device, the entire thickness of the organic emitting display device being defined as a distance from a bottom surface of the first substrate to a top surface of the sealing member.

2. The organic light-emitting display device as claimed in claim 1, wherein the organic emission unit further comprises a pixel circuit comprising at least one thin film transistor, the at least one thin film transistor being electrically connected to the first electrode and being completely overlapped with the first electrode.

3. The organic light-emitting display device as claimed in claim 2, wherein the organic emission unit further comprises at least one conductive line electrically connected to the thin film transistor, and wherein the at least one conductive line is disposed between the first substrate and the first electrode and crosses the first electrode.

4. The organic light-emitting display device as claimed in claim 3, wherein the empty space defines a transmission window through layers in the transmitting region, a depth of the transmission window being a continuous opening extending along a thickness of the organic emission unit and the at least one thin film transistor.

5. The organic light-emitting display device as claimed in claim 4, wherein the transmission window exposes an upper surface of the first substrate.

6. The organic light-emitting display device as claimed in claim 1, wherein the first electrode comprises a reflective metal.

7. The organic light-emitting display device as claimed in claim 6, wherein the second electrode comprises a transparent metal.

8. The organic light-emitting display device as claimed in claim 1, wherein the sealing member is a substrate, and wherein the one surface of the sealing member faces the second electrode.

9. The organic light-emitting display device as claimed in claim 8, further comprising a sealant being disposed between edge portions of the first substrate and the sealing member.

10. The organic light-emitting display device as claimed in claim 1, wherein the sealing member is a sealing film, and wherein the sealing film comprises at least one inorganic material and at least one organic material disposed on the at least one inorganic material.

11. The organic light-emitting display device as claimed in claim 10, wherein the one surface of the sealing member is an opposite surface of a surface facing the second electrode.

12. The organic light-emitting display device as claimed in claim 11, further comprising a first passivation layer, and the color filter is disposed between the sealing film and the first passivation layer.

13. The organic light-emitting display device as claimed in claim 1, wherein the second electrode extends in the pixel region and at least partially in the transmitting region, the empty space in the transmitting region defining a transmission window at least through the second electrode.

14. The organic light-emitting display device as claimed in claim 13, further comprising a second passivation layer disposed between the first substrate and the first electrode, wherein the second passivation layer extends in the pixel region and at least partially in the transmitting region, the empty space in the transmitting region defining the transmission window at least through the second electrode and the second passivation layer.

15. The organic light-emitting display device as claimed in claim 14, further comprising a pixel defining layer disposed between the first electrode and the emissive layer, the empty space in the transmitting region defining the transmission window at least through the second electrode, the second passivation layer, and the pixel defining layer.

16. The organic light-emitting display device as claimed in claim 1, further comprising a hole injection layer and a hole transport layer, an electron transport layer and an electron injection layer, wherein the hole injection layer and the hole transport layer are sequentially disposed between the first electrode and the emissive layer, and wherein the electron transport layer and the electron injection layer are disposed between the emissive layer and the second electrode.

17. The organic light-emitting display device as claimed in claim 1, wherein all elements in the transmitting region transmit visible external light.

18. The organic light-emitting display device as claimed in claim 1, wherein the empty space defines a transmission window having a width overlapping a majority of a width of the transmitting region.

19. An organic light-emitting display device having at least a pixel region and at least a transmitting region, the organic light-emitting display comprising:
   a first substrate;
   an organic emission unit disposed on the first substrate, wherein the organic emission unit includes:
      a first electrode in the pixel region, an emissive layer disposed on the first electrode, a second electrode disposed on the emissive layer, a hole injection layer and a hole transport layer, an electron transport layer and an electron injection layer,
      wherein the hole injection layer and the hole transport layer are sequentially disposed between the first electrode and the emissive layer, and wherein the electron transport layer and the electron injection layer are disposed between the emissive layer and the second layer;
   a sealing member disposed on the second electrode; and
   a color filter disposed on one surface of the sealing member, the color filter being overlapped with the first electrode,
   wherein an external light incident on the transmitting region passes through the transmitting region of the organic light-emitting display device, and
   wherein the hole injection layer, the hole transport layer, the electron transport layer and the electron injection layer are extended to the transmitting region,
   wherein portions of the organic light-emitting display device overlapping the transmitting region are transparent through an entire thickness of the organic light-emitting display device, the entire thickness of the organic emitting display device being defined as a distance from a bottom surface of the first substrate to a top surface of the sealing member.

* * * * *